United States Patent Office 3,357,857

Patented Dec. 12, 1967

3,357,857

METHOD OF PASSIVATING SUPPORTS FOR SEMICONDUCTOR SULPHIDES, SELENIDES AND TELLURIDES

Henri Provisor, St. Maurice-Suresnes, and Gerard Lapluye, Versailles, France, assignors to North American Philips Company, Inc., New York, N.Y, a corporation of Delaware No Drawing. Filed May 8, 1964, Ser. No. 366,183
4 Claims. (Cl. 117—213)

ABSTRACT OF THE DISCLOSURE

Passivating the substrate for receiving a semiconductor sulphide, selenide or telluride to avoid contamination thereof, by first applying to the substrate surface an inorganic metal compound different from the semiconductor material, and thereafter heating the substrate at a temperature of at least 400° C. The metal constituent of the compound is selected from the group of beryllium, magnesium, calcium, strontium, barium, aluminum, zinc, and cadmium.

This invention relates to a support for layers of semiconductor sulphides, selenides or tellurides. Such semiconductor layers applied to a support are used, for example, in photoelectric cells having two electrodes and other semiconductor devices such as unipolar transistors, e.g. radiation-controlled unipolar transistors having three electrodes.

With semiconductor devices it is important that the semiconductor material should have a fundamentally high purity, though it may be doped at will with given impurities in a given concentration in order to obtain the desired properties. With photoconductive cells it is desirable, for example, to obtain a higher light sensitivity, and that the dark resistance between the electrodes should be very high. These requirements involve that the applied semiconductor material should not be adversely affected by the support material, for example by introducing undesirable impurities into the layer. After the application of the layer there is often carried out a thermal treatment to obtain a further improvement in the electrical properties of the layer and the adhesion to the substrate, in which case temperatures of more than 500° C. may be employed. However, such a thermal treatment may increase the risk of contamination by the substrate.

Hitherto efforts have been made to counteract such an influence of the substrate by using a support of highly pure materials, which are inert in this state of purity with respect to the semiconductor material.

Such known materials for the supports of photo-electric cells are for example quartz, alumina and some kinds of borosilicate glasses, for instance glasses known under the tradename of "Pyrex." Such materials have been proposed in French patent specification 1,139,935 and in German patent specification 1,093,924. The said support materials are, however, comparatively expensive, so that in the manufacture of semiconductor devices with semiconductor layers applied to a support the costs of the support form a considerable part of the cost price of such a device.

Among the cheaper materials there are glasses in the form of thin plates which can withstand a heating at about 600° C. without being excessively deformed. In general, these cheaper glasses are kinds of glasses such as borosilicate glasses other than "Pyrex," in particular alkalizinc borosilicate glasses, such as glass known under the tradename of "Corning 0211."

Cheap support plates having satisfactory mechanical properties at the temperature indicated may also be obtained by sintering (by agglomeration) and casting given kinds of granulated glass, particularly borosilicate glass on the glass, known under the tradename of "Pyrex."

However, during the thermal treatment at a temperature exceeding 500° C. these cheaper glass materials react with the photoconducting layer. This reactivity becomes manifest in the appearance of very high dark currents, which render the cells, in general, worthless.

The invention is based on the idea that the support surface can be treated so that even with a heating at a high temperature the support can be rendered effectively passive relative to the conducting layer, even when the support is made of one of the aforesaid cheap materials, which would normally increase the dark current.

In accordance with the invention, prior to the application of the semiconductor to the support one or more compounds of the metals Be, Mg, Ca, Sr, Ba, Al, Zn and Cd, other than the semiconductor material, is applied, after which the support is heated at a temperature of at least 400° C. If the semiconductor material afterwards applied to the support is heated, the temperature for passivating the support may be chosen to be approximately equal to or higher than the temperature of heating the semiconductor.

A particularly simple method of applying the metal compounds concerned consists in dipping the support in a solution (for example an aqueous solution) of one or more soluble compounds e.g. chlorides, nitrates, sulphates and/or other salts of one or more of the aforementioned metals. The concentration of one or more of these salts of one of the metals of a total of various kinds thereof expressed in gram atoms per mol of the solvent preferably lies between 1% and 0.001%.

In the following example one method of carrying out the treatment according to the invention will be described.

The supporting plates of one of the said materials are degreased by known means. They are heated in air for 15 minutes at about 600° C. and then cooled within 30 minutes. They are then dipped for two minutes in a boiling aqueous solution of $CdCl_2 \cdot 2.5H_2O$ of 2% by weight. The plates are dried and subsequently heated in air at about 600° C. for 5 minutes and then cooled within 30 minutes. The plates are then washed in boiling water until the washing water, by addition of silver nitrate, no longer shows any turbidity. After drying passivated supporting plates are obtained, so that they are ready for the application of the photo-sensitive layer.

The treatment described above provides a transparent, uniform layer on the surface of the plate. Fair results with respect to passivation are also obtained by omitting the first step of heating, hence at room temperature the support is dipped in a cadmium chloride solution, the step of washing subsequent to the thermal treatment at 600° C. being also omitted. This method improves the reproducibility of the properties of the photo-conducting cells.

The effect of passivation obtained by the aforesaid treatment is proved by the dark currents measured at cells prepared in the same manner with the only difference that some supports have been subjected to said treatment and some other supports have been degreased only and heated at 600° C. prior to the application of the photo-conducting layer. In all cases the layer consists of cadmium sulphide. The support consists in these cases of glass of the kind known under the tradename of "Corning 0211."

| Experiments | $I_l$ 54 Lux, 10 v., 15 sec., mA | $I_d$ 20 sec., 100 v., uA |
|---|---|---|
| Material of the support | 3.90 | 950 |
| "Corning 0211" | 4.60 | 500 |
| Not passivated | 3.50 | 200 |
| | 5.40 | 875 |
| Sensitive layer of CdS | 3.90 | 450 |
| | 9.0 | 1,000 |
| Material of the support | 4.50 | 1.9 |
| "Corning 0211" | 6.8 | 2.8 |
| Passivated | 6.3 | 3.5 |
| | 7.0 | 4.1 |
| Sensitive layer of CdS | 4.2 | 1.7 |
| | 7.6 | 3.4 |

The measurements were carried out under the following conditions:

(1) photo current $I_1$
exposure intensity 54 Lux
voltage 10 v.
measured after 15 seconds.

(2) Dark current $I_d$
exposure intensity 0
voltage 100 v.
measured after 20 seconds.

Similar results are obtained by using a cadmium nitrate solution of the same molar concentration instead of the cadmium chloride solution.

The use of the chlorides of Ca, Ba and Mg also produces marked passivation effects, although to a lesser extent than the treatment with cadmium chloride.

The aforesaid effect of passivation may be ascribed to the following hypothesis. Cheap supporting materials such as cheap kinds of glass contain alkali metals and/or boron in the form of ions, which are released at the surface of the support at the temperature of the treatment of the photo-sensitive layer and which penetrate into the semiconductor material, which is thus poisoned and/or which reacts otherwise with the adjacent material such that the interface between the support and the layer has such a conductivity that leakage currents may occur. The said treatment might produce an exchange between comparatively movable ions, for example alkali ions, and more rigidly bound ions and might saturate any free valencies at the surface of the support. However, the invention is not based on said hypothesis.

Since it is proved to be possible to obtain satisfactory results in practice, so attempts have been made to prove the validity of said hypothesis, so that the present invention does not depend on this possible explanation.

What is claimed is:

1. In a method for making a semiconductor device employing semiconductor sulphides, selenides or tellurides as the semiconductor material wherein a layer of the semiconductor material is applied to a support constituted at its surface of a borosilicate glass which when heated in direct contact with the semiconductor material degrades its properties, the improvement comprising before the semiconductor material is applied passivating the surface of said support by contacting it with an aqueous solution of at least one water soluble inorganic metal compound different from the semiconductor material, said metal being selected from the group consisting of beryllium, magnesium, calcium, strontium, barium, aluminum, zinc and cadmium, and thereafter heating the support at a temperature of at least 400° C. and up to about the order of 600° C.

2. A method as set forth in claim 1 wherein, following the step of heating the support, the surface of the support is rinsed.

3. A method as set forth in claim 1 wherein the glass is an alkali zinc borosilicate glass, and the compound is selected from the group consisting of chlorides, nitrates, and sulphates.

4. A method as set forth in claim 1 wherein, following the passivating heating step, the semiconductor material is applied to the support and then heated at a temperature equal to or less than that of the passivating heating step.

References Cited

UNITED STATES PATENTS

| | | | |
|---|---|---|---|
| 2,675,331 | 4/1954 | Cusano et al. | 117—33.5 |
| 2,617,741 | 11/1952 | Lytle | 117—213 X |
| 2,879,362 | 3/1959 | Meyer | 117—215 X |
| 3,148,084 | 9/1964 | Hill et al. | 117—213 X |
| 3,188,594 | 6/1965 | Koller et al. | 117—215 |
| 3,222,215 | 12/1965 | Durr | 117—229 X |

ALFRED L. LEAVITT, *Primary Examiner.*

J. R. BATTEN, Jr., *Assistant Examiner.*